United States Patent
Carr et al.

[11] Patent Number: 5,918,648
[45] Date of Patent: Jul. 6, 1999

[54] METHOD AND APPARATUS FOR MEASURING VOLUME

[75] Inventors: Gregory L. Carr, Newburyport; William Cavallaro, Bradford; John Lienhard, Lexington, all of Mass.

[73] Assignee: Speedline Techologies, Inc., Franklin, Mass.

[21] Appl. No.: 08/803,913

[22] Filed: Feb. 21, 1997

[51] Int. Cl.[6] ................................................ B65B 1/04
[52] U.S. Cl. ........................... 141/198; 141/95; 141/83; 427/8; 427/96; 118/712
[58] Field of Search ................ 141/4–8, 83, 95, 141/96, 198; 118/712, 668, 679; 427/8, 96; 73/297 R

[56] References Cited

U.S. PATENT DOCUMENTS

| | | |
|---|---|---|
| 1,184,779 | 5/1916 | Shaw . |
| 1,252,875 | 1/1918 | Ashmusen . |
| 1,699,236 | 1/1929 | Goldrick . |
| 2,274,241 | 2/1942 | Lemanski . |
| 2,410,516 | 11/1946 | Messenger et al. . |
| 3,586,129 | 6/1971 | Cass . |
| 4,043,711 | 8/1977 | Seino . |
| 4,646,969 | 3/1987 | Sorm et al. . |
| 4,967,933 | 11/1990 | Maiorca et al. . |
| 5,044,900 | 9/1991 | Cavallaro . |
| 5,052,338 | 10/1991 | Maiorca et al. . |
| 5,110,615 | 5/1992 | Maiorca et al. .......................... 427/8 |
| 5,232,736 | 8/1993 | Tribbey et al. .......................... 427/8 |
| 5,277,927 | 1/1994 | Burns et al. ............................ 427/8 |
| 5,320,250 | 6/1994 | La et al. . |
| 5,465,879 | 11/1995 | La et al. . |
| 5,505,777 | 4/1996 | Ciardella et al. . |
| 5,540,946 | 7/1996 | DeVries et al. ......................... 427/8 |
| 5,666,325 | 9/1997 | Belser et al. . |

FOREIGN PATENT DOCUMENTS

| | | |
|---|---|---|
| 114905 | of 1918 | United Kingdom . |
| WO 97/13586 | 4/1997 | WIPO . |
| WO 97/18054 | 5/1997 | WIPO . |

OTHER PUBLICATIONS

Engel, Jack, Selecting The Proper Dispensing Tip, Surface Mount Technology, Oct. 1990.

Hogan, Brian, J. Adhesive Dispenser Provides ± 2% vol. Repeatability, Design News, Apr. 11, 1994.

*Primary Examiner*—Steven O. Douglas
*Attorney, Agent, or Firm*—Mintz, Levin, Cohn, Ferris Glovsky and Popeo, P.C.

[57] ABSTRACT

A dispensing system for dispensing material onto a substrate. In one embodiment, the material is dispensed into a cavity of the substrate, the cavity having an unknown volume. The dispensing system includes a housing, a dispensing apparatus, coupled to the housing, that dispenses a metered quantity of material, and a volumetric measuring probe, coupled to the housing, and positionable over the cavity of the substrate to measure the volume of the cavity. In embodiments, the volumetric measuring probe includes a concave section having a mating edge that is constructed and arranged to create a substantially airtight seal between the probe and the substrate, a chamber, a first valve, disposed between the chamber and the concave section, a pressure transducer coupled to the concave section to determine air pressure within the concave section, an air inlet port, a second valve, disposed between the air inlet port and the concave section, an air exhaust port, and a third valve, disposed between the chamber and the exhaust port. In one embodiment, the volumetric measuring probe determines the volume of material dispensed from the dispensing system.

29 Claims, 6 Drawing Sheets

METHOD AND APPARATUS FOR MEASURING VOLUME

FIELD OF THE INVENTION

The present invention relates generally to a method and apparatus for measuring volume of concave or convex regions, and more particularly, to a method and apparatus for measuring the volume of a convex or concave region of a substrate such as a printed circuit board.

DISCUSSION OF THE RELATED ART

There are several types of prior art dispensing machines used for dispensing metered amounts of liquid or paste for a variety of applications. One such application is in the assembly of printed circuit boards or integrated circuit chips. In these applications, dispensing machines are used for encapsulating integrated circuits and/or for underfilling flip integrated circuit chips. The dispensing systems described above include those manufactured and distributed by Camelot Systems, Inc., the assignee of the present invention, under the name CAM/A LOT®.

FIG. 1 shows a prior art liquid dispensing system 100 used for dispensing a viscous material into a cavity 12 of an integrated circuit 10. Other substrates such as a printed circuit board may be used in place of the integrated circuit 10. In one application, the viscous material is an encapsulant material used to protect components and wire bonds within the cavity 12 from heat, moisture, and mechanical effects such as shock and vibration. In typical applications, the viscous material may be one of several materials such as HYSOL® 4526, HYSOL® 4450, HYSOL® 4451, and HYSOL® 4460. The liquid dispensing system 100 includes a pump and dispenser assembly 110 and a computer control system 120. The liquid dispensing system 100 has a frame 114 having a lower base 118 for supporting the integrated circuit 10. The pump and dispenser assembly 110 is coupled to an arm 116 which in turn is movably coupled to the frame 114 of the dispensing system 100. The arm 116 can be moved, using motors (not shown), under the control of the computer system, in X, Y and Z directions, to locate the pump and dispenser assembly 110 at predetermined locations and heights over the integrated circuit 10 to dispense the viscous material into the cavity 12.

The pump and dispenser assembly 110 dispenses drops of material through a nozzle 112 at predetermined locations on the integrated circuit 10. The viscous material is stored in a container (not shown), coupled to the pump and dispenser assembly, at a constant pressure. In one prior art dispenser, the pump and dispenser assembly 110 contains an auger within an auger chamber. The auger is precisely turned within the auger chamber to dispense metered quantities of liquid. The auger and auger chamber are further described in patent application Ser. No. 08/562,068 entitled "Liquid Dispensing System With Improved Sealing Augering Screw and Method For Dispensing", assigned to the assignee of the present invention, and incorporated herein by reference.

FIG. 2 shows a top view of the integrated circuit 10 and FIG. 3 shows a cross-sectional view of the integrated circuit 10, taken along line 3-3 of FIG. 2, showing the integrated circuit and the cavity 12 in greater detail. The cavity 12 may contain one of several components 14, 16 and 18, which may be connected through wire bonds 20 to conductive traces 22 in the integrated circuit 10. The traces 22 in the integrated circuit are coupled to pads 24. In the integrated circuit 10, three components 14, 16 and 18 are shown in the cavity 12. Typical integrated circuits may include many more components than just the three shown in the integrated circuit 10. Further, the components, may be irregular in shape, rather than cube-shaped as shown in FIGS. 2 and 3.

Also shown in FIGS. 2 and 3 is a ring 26. The ring 26 is used to contain the encapsulant material within the cavity 12 to prevent it from flowing over the surface of the integrated circuit 10. The ring 26 may be placed on the integrated circuit using the dispensing system 100. The material used to create the ring 26, is generally less viscous than the encapsulant material. In some integrated circuits, the ring 26 may not be used. In these integrated circuits, the encapsulant material is filled to a height less than the top surface of the integrated circuit to prevent the encapsulant material from flowing over the surface of the integrated circuit. The use of the ring 26 allows the encapsulant material to be at a height greater than the top surface of the integrated circuit to ensure that the wire bonds 20 are contained within the encapsulant material. The ring 26 may also be used as a dam to contain encapsulant material for substrates not having a cavity.

One problem encountered in prior art dispensing systems is the difficulty associated with determining the proper quantity of encapsulant material to be dispensed into the cavity 12 to properly encapsulate the components and wire bonds without dispensing too much material such that additional rework or cleaning must be done to the surface of the integrated circuit. In some prior art dispensing systems, the quantity of encapsulant material to be dispensed is determined on a trial and error basis such that for each lot of integrated circuits to be encapsulated, a number of integrated circuits from the lot are selected as trial integrated circuits and the amount of material dispensed is varied for each of these trial circuits. Each of the trial circuits are then examined, and the quantity of material to be dispensed for the remaining integrated circuits of the lot is determined based on the results of the trial circuits. This trial and error process is very time consuming, is imprecise, and results in either excessive waste, or the need to rework a number of integrated circuits. Further, this method does not account for any variations that may occur within samples of a given lot.

Other methods of determining the volume also have associated drawbacks. The use of optical measuring devices for measuring the internal dimensions of the cavity 12 to determine the volume thereof, has been considered, however, because of the irregularity of the components, and because it is desirable for the encapsulant to underfill any regions that exist between the components and the base of the cavity, these optical measuring devices cannot be used to provide accurate volume measurements.

A second drawback of prior art dispensing systems is that it is difficult to properly inspect material after it has been dispensed onto a substrate. This drawback is of particular concern in dispensing systems used to dispense small dots or balls of material (such as solder paste) onto a substrate (such as a circuit board), wherein the volume of the dots or balls is to be precisely monitored. For example, in the surface mount technology industry it is desirable to dispense balls of solder of precise size in the form of an array on a substrate in what is known as a ball grid array (BGA). In these systems, it is desirable to inspect the balls or drops on the substrate to ensure that the volume of the drops is within predetermined limits. In some prior art dispensing systems, a viewing system incorporating a CCD camera is used to inspect the material on the substrate after dispensing has occurred. The inspection capabilities of these viewing systems is somewhat limited in that it is difficult to determine volume of irregularly shaped dots or balls based on a two dimensional image provided by a CCD camera.

SUMMARY OF THE INVENTION

Embodiments of the present invention overcome the drawbacks of the prior art dispensing systems described above, and provide a method and apparatus for determining the volume of a cavity to be filled by an encapsulant and for determining the volume of material dispensed from a dispensing system.

In the first embodiment of the present invention, a dispensing system for dispensing material into a cavity of a substrate includes a housing, a dispensing apparatus that dispenses a metered quantity of material, and a volumetric measuring probe, coupled to the housing, and positionable over the cavity of the substrate to measure the volume of the cavity.

In an alternate version of the first embodiment, the dispensing system further includes a computer control system coupled to the dispensing apparatus to control the quantity of material dispensed, and coupled to the volumetric measuring probe to receive measurement information from the volumetric measuring probe to determine the volume of the cavity.

In another alternate version of the first embodiment, the computer control system is configured to control the quantity of material dispensed based on the determined volume of the cavity. Further, the volumetric measuring probe is positionable over the substrate after the material has been dispensed to measure the volume of the material dispensed.

In yet another alternate version of the first embodiment, the volumetric measuring probe includes a concave section having a mating edge that is constructed and arranged to create a substantially airtight seal between the probe and the substrate, a chamber, a first valve, disposed between the chamber and the concave section, and a pressure transducer coupled to the concave section to determine the air pressure within the concave section. The probe is constructed and arranged such that when the probe is sealed to the substrate, a substantially airtight chamber is formed having a volume equal to the sum of the volume of the concave section and the volume of the cavity of the substrate. The volumetric measuring probe further includes an air inlet port adapted to be coupled to a pressurized air source, a second valve, disposed between the air inlet port and the concave section, an exhaust port, and a third valve, disposed between the chamber and the air exhaust port.

A second embodiment of the present invention is directed to a method of measuring volume of a concave or convex region of a substrate using a measuring probe having a concave section and having a secondary chamber. The method includes steps of coupling the mating edge of the measuring probe to the substrate to create a substantially airtight chamber, measuring a first air pressure within the airtight chamber, coupling the airtight chamber to the secondary chamber, measuring a second air pressure within the airtight chamber, and determining the volume of the region of the substrate based on the first and second air pressures and based on the volume of the concave section and the volume of the secondary chamber.

In an alternate version of the second embodiment of the present invention, the probe is part of a dispensing system for dispensing material into the concave region, and the method further includes steps of setting a quantity of material to be dispensed based on the measured volume of the concave region, dispensing material from the dispensing system into the concave region, and using the measuring probe, measuring the volume of the material dispensed.

In a third embodiment of the present invention, a dispensing system for dispensing material into a cavity of a substrate includes a housing, a dispensing apparatus, coupled to the housing, that dispenses a metered quantity of material, and means for measuring the volume of a cavity.

In an alternate version of the third embodiment, the dispensing system further includes means for controlling the quantity of material dispensed from the dispensing apparatus based on the volume of the cavity, and means for measuring the volume of material dispensed from the dispensing apparatus.

In a fourth embodiment of the present invention, a dispensing system for dispensing material onto a substrate includes a housing, a dispensing apparatus that dispenses a metered quantity of material, and a volumetric measuring probe that measures the volume of the material.

In an alternate version of the first embodiment, the volumetric measuring probe of the fourth embodiment further includes a concave section, a chamber, a first valve disposed between the chamber and the concave section and a pressure transducer.

In another alternate version of the first embodiment, the volumetric measuring probe further includes a first port, a second valve disposed between the first port and the concave section, a second port, and a third valve disposed between the chamber and the second port.

BRIEF DESCRIPTION OF THE DRAWINGS

For a better understanding of the present invention, reference is made to the drawings which are incorporated herein by reference and in which.

DETAILED DESCRIPTION

For purposes of illustration only, and not to limit generality, the present invention will now be explained with reference to a dispensing system used to dispense an encapsulant material into a cavity of an integrated circuit. One skilled in the art will appreciate, however, that embodiments of the present invention are not limited to dispensing systems, but rather, the volumetric measuring apparatus in accordance with embodiments of the present invention may be used in other applications requiring precise, volume measurements of convex or concave regions of a substrate such as a circuit board.

Figure 4:
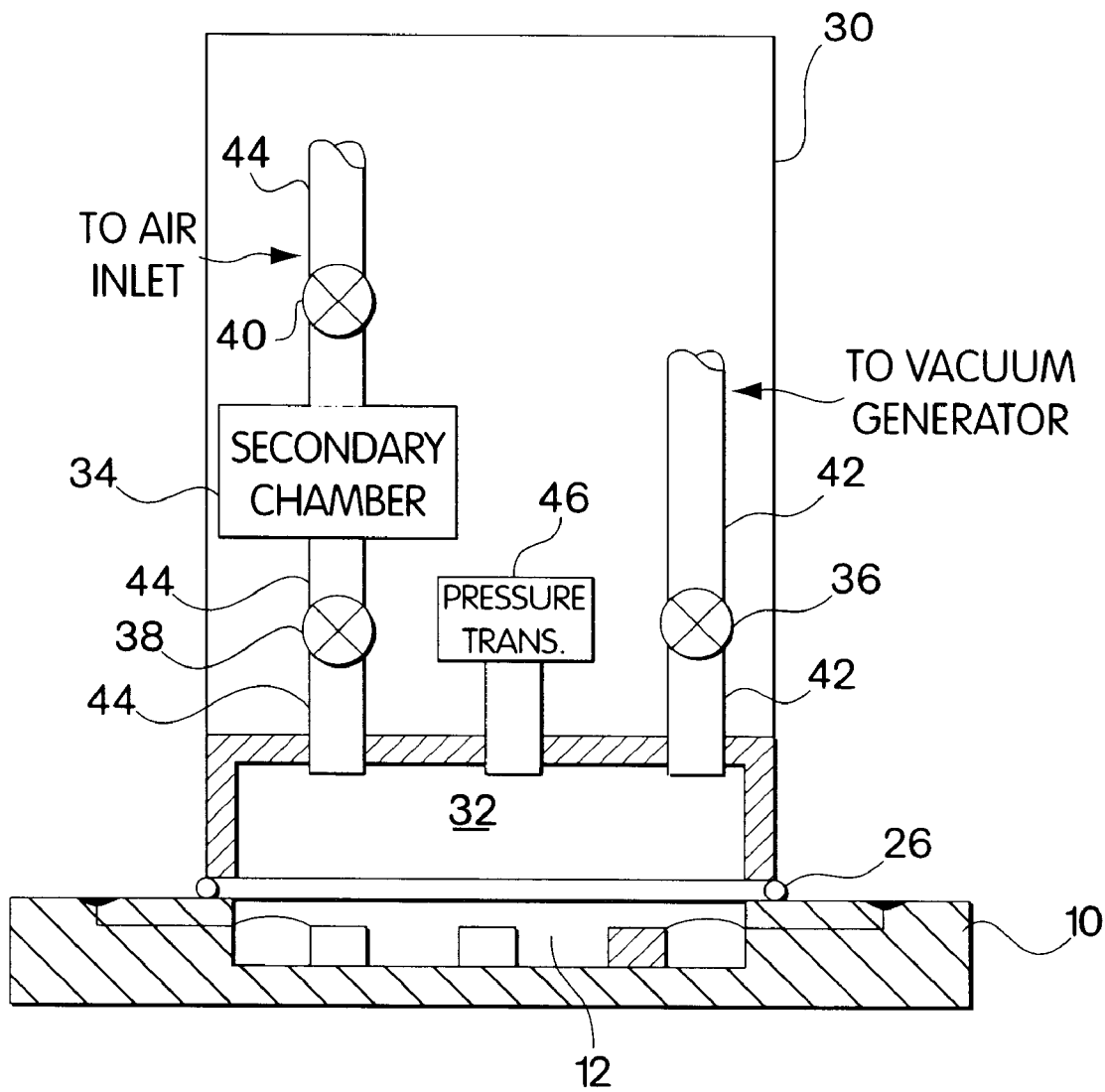
FIG. 4 shows a volumetric measuring probe disposed over the integrated circuit of FIGS. 2 and 3 for measuring the volume of the cavity to be filled with encapsulant material.

A first embodiment of a volumetric measuring probe 30 in accordance with the present invention is shown in FIG. 4.

Figure 3:
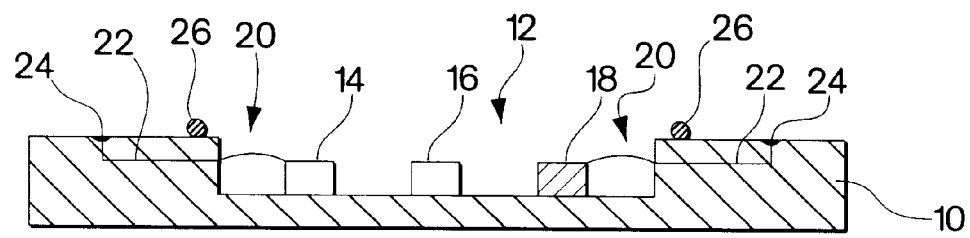
FIG. 3 is a cross-sectional view of the integrated circuit of FIG. 2 taken along line 3—3.
Figure 2:
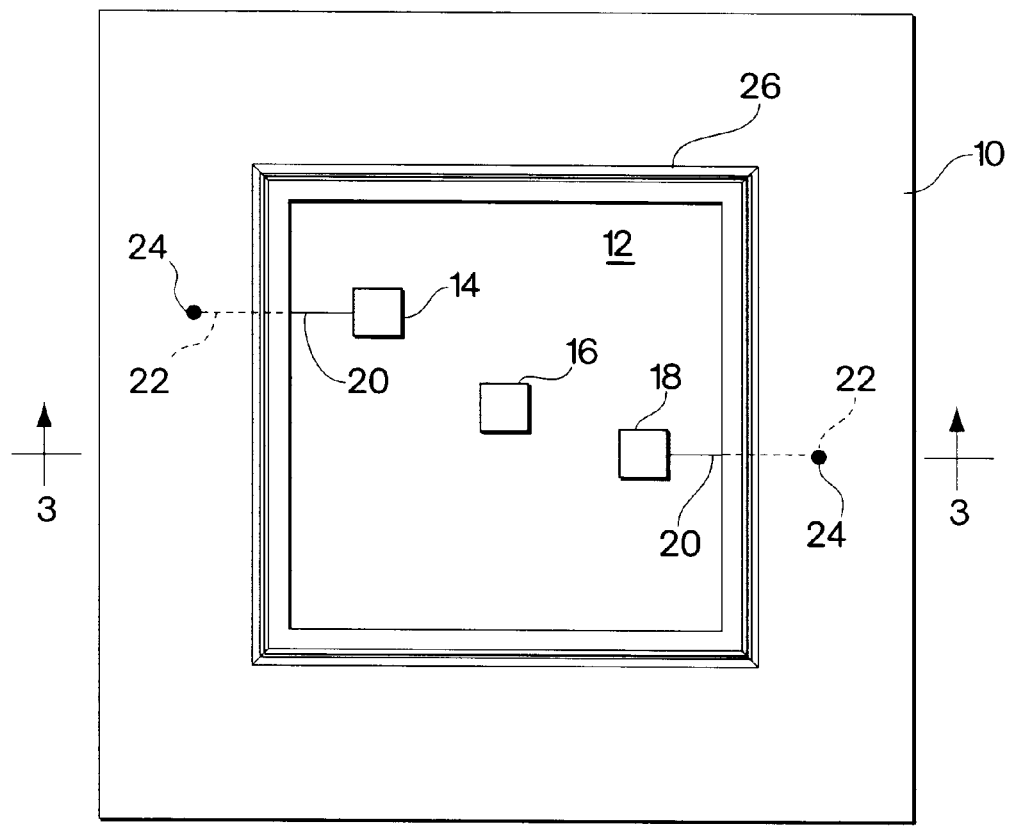
FIG. 2 is a top view of an integrated circuit having a cavity to be filled with encapsulant material from a dispensing system.

The volumetric measuring probe 30 is disposed over the cavity 12 of the integrated circuit 10 of FIGS. 2 and 3. The probe 30 is designed to provide a 360° airtight seal against the ring 26, or for integrated circuits not having a ring 26, the probe 30 makes an airtight seal with the top surface of the integrated circuit. The volumetric measuring probe 30 has a cavity 32 having a volume equal to a known value $V_1$. The volumetric measuring probe 30 has an air outlet channel 42 for coupling to a vacuum generator (not shown) and an air inlet channel 44 for allowing air to flow into the probe. The air outlet channel has a valve 36 that may be opened to allow the vacuum generator to draw air from the cavity 32. A pressure transducer 46 is used to measure the air pressure within the cavity 32. The air outlet channel 44 has a first valve 38 that in an open position allows air to flow between the cavity 32 and a secondary chamber 34. The air inlet channel 44 also has a second valve 40 for controlling the flow of air between the secondary chamber and the air inlet.

The secondary chamber 34 is shown in FIG. 4 as a rectangular chamber located in the inlet channel 44 between valves 38 and 40. In an alternate embodiment, the secondary chamber is simply formed by the length of the inlet channel between the first and second valves 38 and 40.

The volumetric measuring probe 30 is used to measure the volume of the cavity 12 of the integrated circuit 10 as follows. For purposes of this discussion, the volume of the cavity 12 is represented by $V_c$, the volume of the cavity 32, including the volume of channels 42 and 44 between the cavity 32 and the valves 36 and 38, is equal to $V_1$, and the volume between valve 38 and valve 40, including the volume of secondary chamber 34, is equal to $V_2$. Volumes $V_1$ and $V_2$ are known, predetermined values for a given volumetric measuring probe. The volumetric measuring probe 30 is placed over the integrated circuit 10 such that an airtight seal is formed between the probe 30 and the ring 26. Valves 36, 38 and 40 are initially in their closed position. Valves 38 and 40 are opened and the air pressure within the secondary chamber 34 and within the cavity 32 is allowed to equalize to the ambient air pressure. This ambient air pressure, $P_2$, is measured using the pressure transducer 46. Valves 40 and 38 are then closed.

Valve 36 is then opened and the vacuum generator is used to draw air from cavities 12 and 32 to create a vacuum within the cavities. The pressure within the cavity 32 is again measured using pressure transducer 46. This pressure is equal to $P_1$. Valve 38 is opened, and the pressure within the cavity 12 is measured a third time. This pressure is equal to $P_3$.

Based on the above pressure measurements and the predetermined volumes $V_1$ and $V_2$, the volume of the cavity $V_c$ can be calculated using the Ideal Gas Law. From the Ideal Gas Law, it is known that the product of the pressure within a cavity and the volume of the cavity is equal to the product of the number of moles, n, of gas in the cavity, a constant, R, and the absolute temperature of the gas, T. This relationship is given by Equation (1) below.

$$PV = nRT \qquad \text{Equation (1)}$$

Applying Equation (1) to the volumetric measuring probe after valve 38 has been opened, and after thermal equilibrium has been reestablished on temperature T, it can readily be shown that the relationship defined by Equation (2) applies.

$$P_3(V_3+V_2) = P_2 V_2 + P_1 V_3 \qquad \text{Equation (2)}$$

In Equation (2), $V_3$ equals the volume of cavity 32 plus the volume of cavity 34 ($V_3 = V_1 + V_c$). Solving Equation (2) for $V_c$ yields Equation (3) shown below.

$$V_c = V_2 \left( \frac{P_2 - P_3}{P_3 - P_1} \right) - V_1 \qquad \text{Equation (3)}$$

Using the volumetric probe 30, and the method described above, the volume of the irregularly shaped cavity 12 can be accurately measured. The measured volume of cavity 12 can then be used to determine the appropriate quantity of encapsulant material to dispense into the cavity. As understood by those skilled in the art, in Equations (2) and (3), it is assumed that the net heat loss or heat gain in the probe is negligible. In order to ensure precise measurements using the volumetric measuring probe 30, valve 38 is arranged to prevent transfer of gas between the secondary chamber 34 and the cavity 32 when the valve is opened or closed.

In the embodiment of the volumetric measuring probe described above, a vacuum generator is used to reduce the air pressure within cavity 32 to create a pressure differential that can be precisely detected by the pressure transducer 46. In an alternate embodiment of a volumetric measuring probe in accordance with the present invention, the vacuum generator may be replaced with a pressurized air source, and the air pressure within the cavity 32 may be increased to provide a pressure differential. The method of measuring volume described above, using Equations (2) and (3) is applicable to the alternate embodiment in which a pressurized air source is used.

The proper pressure to which the cavity should be raised in the alternate embodiment of the present invention can be determined based on several factors including the desired accuracy of the volume measurement, the ratio of the volume of the secondary chamber to the combined volume of cavities 12 and 32, and based on the accuracy of the pressure transducer. A pressure transducer available from Omega Engineering Corp. of Stamford, Conn., and identified by Part No. PX811 may be used as the pressure transducer 46. The Omega PX811 has an accuracy rated at 0.1% of fill scale, and is available with full scale readings of 30 pounds per square inch (psi) and 50 psi.

Figure 1:
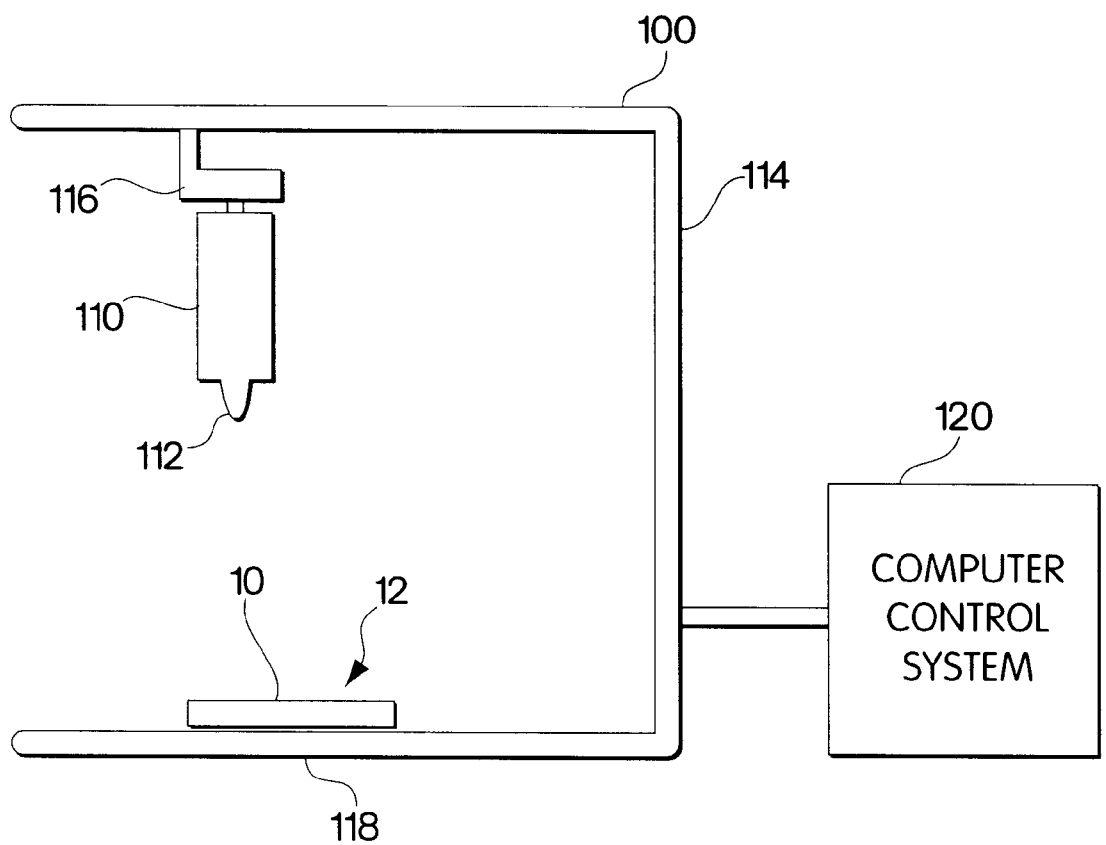
FIG. 1 is a drawing of a dispensing system in accordance with the prior art.
Figure 5:
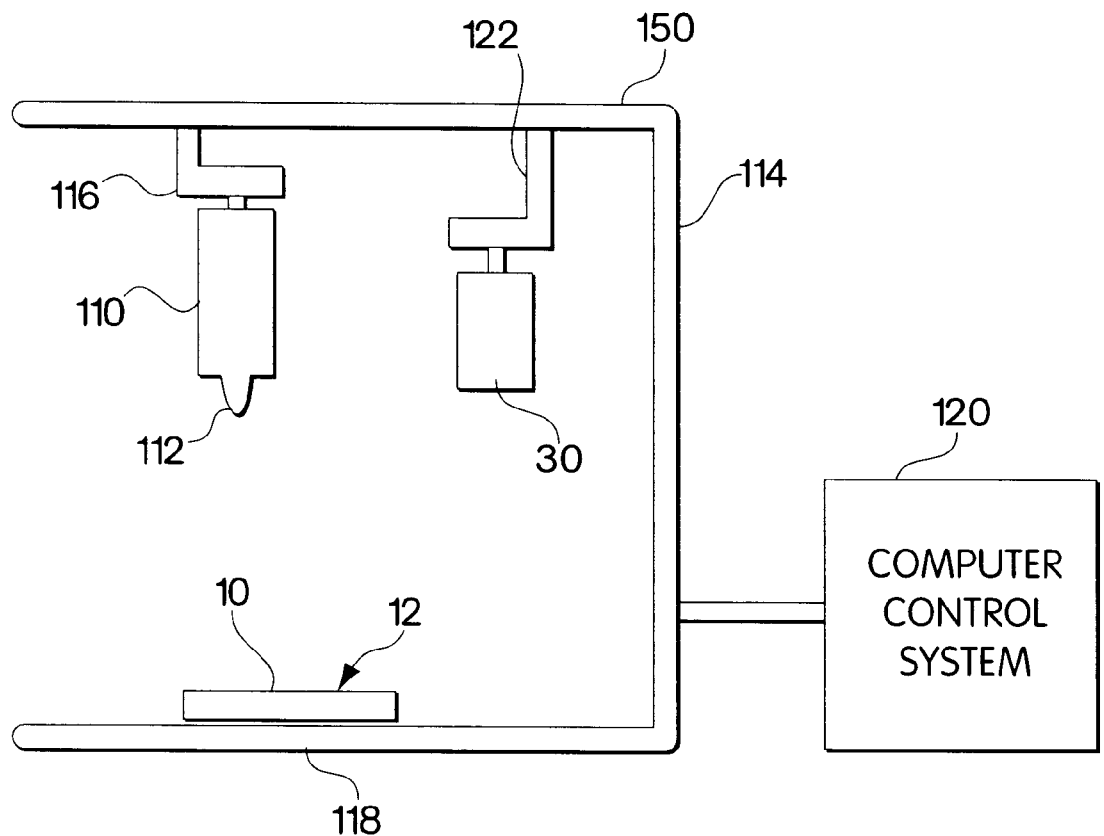
FIG. 5 shows a dispensing system in accordance with one embodiment of the present invention incorporating the volumetric measuring probe of FIG. 4.

One embodiment of a dispensing system 150 incorporating the volumetric measuring probe 30 in accordance with the present invention is shown in FIG. 5. The dispensing system 110 of FIG. 5 is similar to the dispensing system 100 of FIG. 1 except that the volumetric measuring probe 30 is attached to an arm 122 which is movably coupled to the frame 114. As with arm 116, the computer control system 120 controls motors (not shown) to move arm 122 in the X, Y and Z directions to properly position the volumetric measuring probe 30 at the desired locations above the integrated circuit 10.

In the dispensing system 150, the computer control system 120 is coupled to the volumetric measuring probe to control the valves 36, 38 and 40, and to receive readings of pressure within the cavity 32 from the pressure transducer 46. In one embodiment, the computer control system includes a personal computer based on an Intel 486 microprocessor using the DOS operating system. The computer control system is used to completely automate the measurement of the volume of the cavity 12. Also, the computer control system 120 is configured to determine the amount of encapsulant material to be dispensed from the dispenser assembly 110 based on the volume measured.

In embodiments of the present invention, the dispensing system 150 may be configured to measure the volume of the cavity of each integrated circuit that is to be encapsulated, or the dispensing system 150 may be configured such that the volume of the cavity is only measured periodically during a calibration cycle of the dispensing system 150.

In embodiments of the present invention, dispensing systems may include multiple volumetric measuring probes designed to mate with different types of integrated circuits or other substrates to measure cavities contained therein. Also, each of the volumetric measuring probes 30 may be removable or include removable mating adapters, to allow the dispensing system 150 to measure the volume of several different cavities. Also, in embodiments of the present invention, the volumetric measuring probe may be mounted on the same arm as the dispensing apparatus 110.

Figure 6:
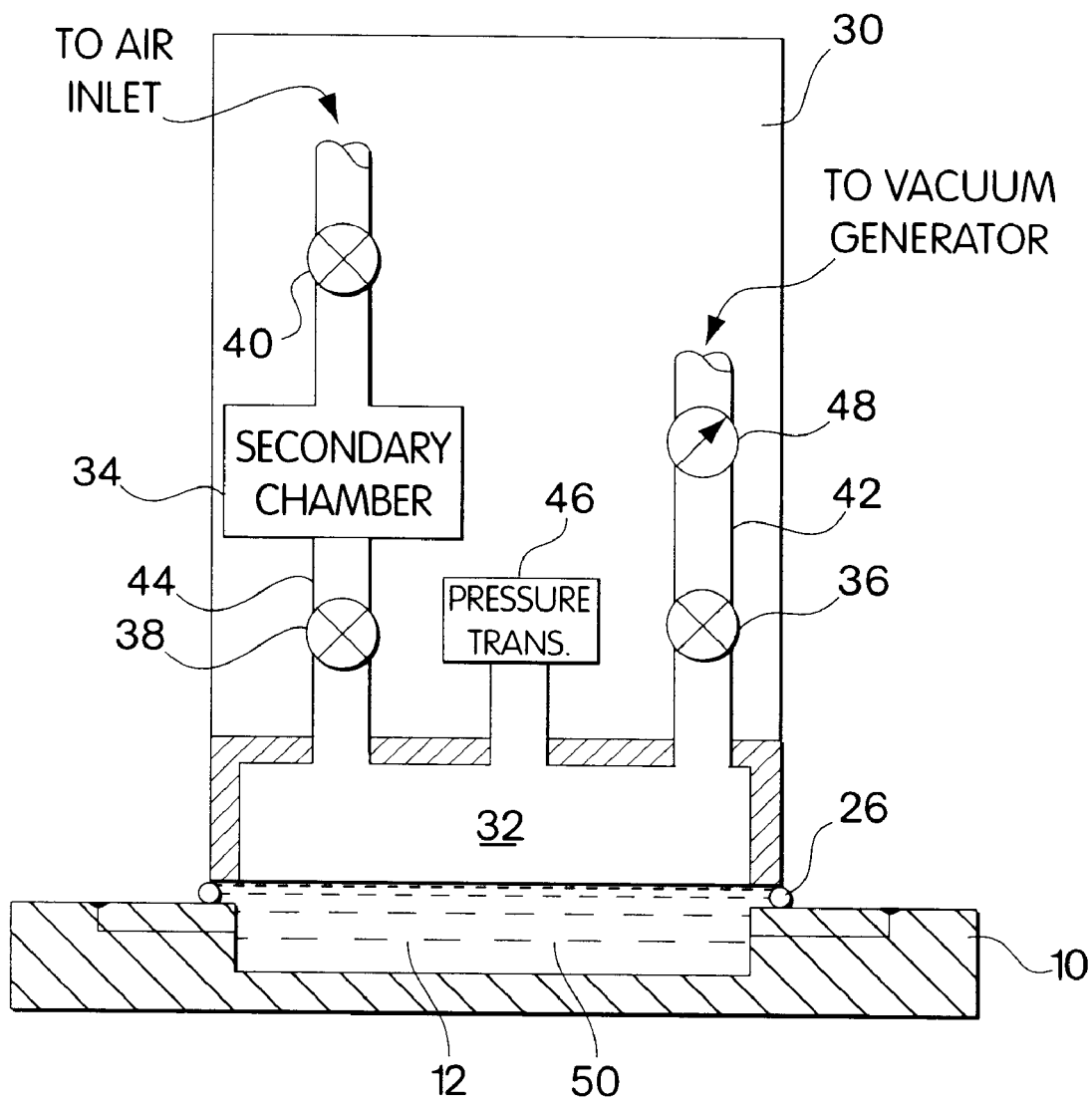
FIG. 6 shows the volumetric measuring probe of FIG. 4 disposed over an integrated circuit after a cavity of the integrated circuit has been filled with encapsulant material.

As will now be discussed with reference to FIG. 6, the volumetric measuring probe 30 in accordance with embodiments of the present invention may also be used as an inspection tool. FIG. 6 shows the volumetric measuring probe 30 mated with the integrated circuit 10 to provide an airtight seal around the ring 26. As shown in FIG. 6, the cavity 12 of the integrated circuit has been filled with encapsulant material 50 by a dispensing system. The procedure described above for measuring the volume of the cavity 12 is again repeated. Ideally, if the encapsulant has completely filled the cavity 12, then the measured volume should be equal to zero. More typically, the measured volume will slightly deviate from zero, indicating that too much or too little encapsulant material has been dispensed. The computer control system can indicate that the quantity of encapsulant material dispensed is not within predetermined tolerances and can adjust the dispensed metered quantity of encapsulant material from the dispensing system, thereby providing a closed loop calibration routine to ensure that the proper quantity of material is dispensed from the dispensing system.

Figure 7:
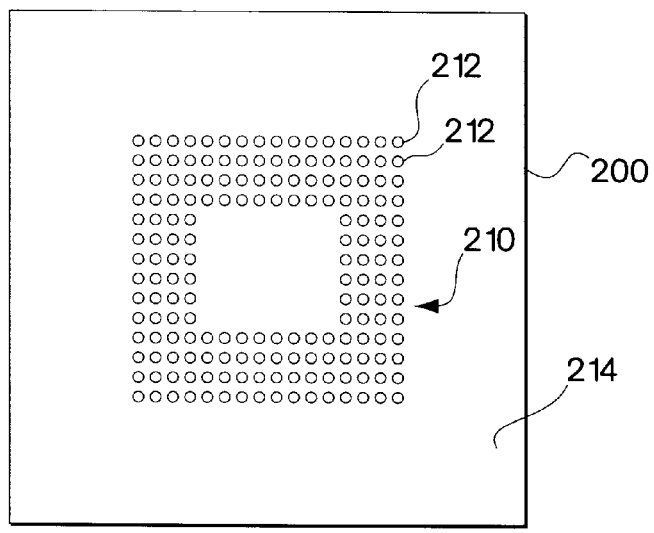
FIG. 7 is a top view of a substrate having a top surface on which is disposed a solder ball grid array.
Figure 8:
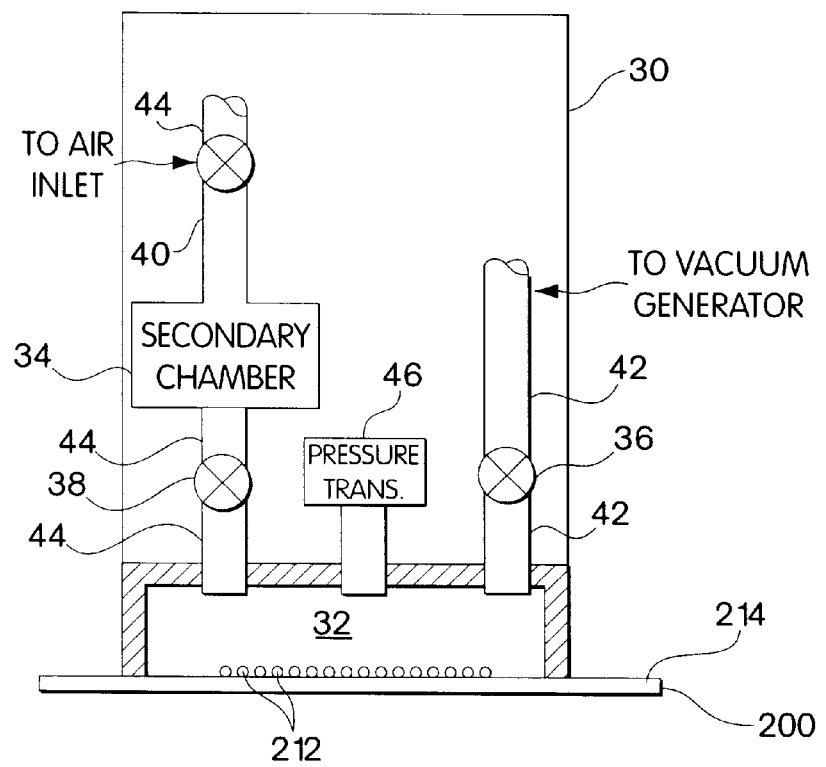
FIG. 8 is a side view of the substrate of FIG. 7 having a volumetric measuring probe in accordance with the present invention disposed over the ball grid array.

When used as an inspection tool, volumetric measuring probes in accordance with embodiments of the present invention are not limited to determining volume of material dispensed into a cavity, but rather, may be used to determine the volume of relatively small dots or balls of material dispensed on a substrate. FIG. 7 shows a substrate 200 having a top surface 214 on which is disposed a number of solder balls 212 arranged in an array 210. FIG. 8 shows a side view of the substrate 200 with a volumetric measuring probe 30 disposed over the array 210 and forming an air tight seal with the top surface 214 of the substrate.

In the manner described above, the volumetric measuring probe can be used to determine the total volume of the solder balls within the cavity 32 of the probe 30. The measured volume can then be compared with predetermined acceptable values.

In alternate embodiments, volumetric measuring probes used as inspection tools may be adapted to measure the volume of only one or several solder balls of a BGA, rather than the total volume of an array as described above.

Dispensing systems that are used to dispense small dots or balls of material and that incorporate volumetric measuring probes in accordance with embodiments of the present invention overcome drawbacks of prior art systems described above, by providing an inspection system that can accurately determine the volume of the dots or balls of material dispensed. The results of volume measurements using embodiments of the present invention may be used to detect defects, and may be used in a closed loop feedback system to regulate the quantity of material dispensed by the dispensing system.

Embodiments of the invention have been described with respect to a dispensing system that dispenses encapsulant material into a cavity of an integrated circuit or some other substrate. As understood by those skilled in the art, embodiments of the volumetric measuring apparatus of the present invention are also suitable for use with systems other than dispensing systems to determine the volume of convex or concave regions.

Having thus described at least one illustrative embodiment of the invention, alterations, modifications and improvements will readily occur to those skilled in the art. Such alterations, modifications and improvements are intended to be within the scope and spirit of the invention. Accordingly, the foregoing description is by way of example only. It is not intended as limiting. The invention's limit is defined only in the following claims and the equivalents thereto.

What is claimed is:

1. A dispensing system for dispensing material into a cavity of a substrate, the cavity having an unknown volume, the dispensing system comprising:
   a housing;
   a dispensing apparatus, coupled to the housing, that dispenses a metered quantity of material; and
   a volumetric measuring probe coupled to the housing and positionable over the cavity of the substrate to measure the volume of the cavity, the volumetric measuring probe including a concave section having a mating edge that is constructed and arranged to create a substantially air tight seal between the probe and the substrate, the concave section having a volume.

2. The dispensing system of claim 1, further comprising a computer control system, coupled to the dispensing apparatus to control the quantity of material dispensed, and coupled to the volumetric measuring probe to receive measurement information from the volumetric measuring probe to determine the volume of the cavity.

3. The dispensing system of claim 2, wherein the computer control system is configured to control the quantity of material dispensed based on the determined volume of the cavity.

4. The dispensing system of claim 3, wherein the volumetric measuring probe is positionable over the substrate after the material has been dispensed from the dispensing apparatus to measure the volume of the material dispensed.

5. The dispensing system of claim 4, wherein the computer control system is configured to adjust the quantity of material dispensed based on the measured volume of the material dispensed.

6. The dispensing system of claim 5, wherein the volumetric measuring probe includes:
   a chamber having a volume;
   a first valve, disposed between the chamber and the concave section, having an open position such that the chamber is coupled to the concave section, and having a closed position such that the chamber is isolated from the concave section;
   a pressure transducer coupled to the concave section to determine air pressure within the concave section; and
   wherein the probe is constructed and arranged such that when the probe is sealed to the substrate a substantially air tight chamber is formed having a volume equal to the sum of the volume of the concave section and the volume of the cavity of the substrate.

7. The dispensing system of claim 6, wherein the volumetric measuring probe further includes:
   an air inlet port adapted to couple to a pressurized air source;

a second valve, disposed between the air inlet port and the concave section, having an open position such that the concave section is coupled to the air inlet port, and having a closed position such that the concave section is isolated from the air inlet port;

an air exhaust port; and a third valve, disposed between the chamber and the air exhaust port, having an open position such that the chamber is coupled to the air exhaust port, and having a closed position such that the chamber is isolated from the air exhaust port.

8. A dispensing system for dispensing material into a cavity of a substrate, the cavity having an unknown volume, the dispensing system comprising:

a housing;

a dispensing apparatus, coupled to the housing, that dispenses a metered quantity of material; and a volumetric measuring probe coupled to the housing and positionable over the cavity of the substrate to measure the volume of the cavity;

wherein the volumetric measuring probe includes:

a concave section having a mating edge that is constructed and arranged to create a substantially air tight seal between the probe and the substrate, the concave section having a volume;

a chamber having a volume;

a first valve, disposed between the chamber and the concave section, having an open position such that the chamber is coupled to the concave section, and having a closed position such that the chamber is isolated from the concave section;

a pressure transducer coupled to the concave section to determine air pressure within the concave section; and wherein the probe is constructed and arranged such that when the probe is sealed to the substrate a substantially air tight chamber is formed having a volume equal to the sum of the volume of the concave section and the volume of the cavity of the substrate.

9. The dispensing system of claim 8 wherein the volumetric measuring probe further includes:

an inlet air port adapted to couple to a pressurized air source;

a second valve, disposed between the air inlet port and the concave section, having an open position such that the concave section is coupled to the air inlet port, and having a closed position such that the concave section is isolated from the air inlet port;

an air exhaust port; and a third valve, disposed between the chamber and the air exhaust port, having an open position such that the chamber is coupled to the air exhaust port, and having a closed position such that the chamber is isolated from the air exhaust port.

10. A method of measuring volume of a concave or convex region of a substrate using a measuring probe having a concave section with a mating edge, the concave section having a volume, the measuring probe further having a secondary chamber having a volume, the method comprising steps of:

coupling the mating edge of the measuring probe to the substrate to create a substantially air tight chamber, the volume of the air tight chamber being equal to the sum of the volume of the concave section and the volume of the region of the substrate for a concave region, and the volume of the air tight chamber being equal to the difference between the volume of the concave section and the volume of the region of the substrate for a convex region;

measure a first air pressure within the air tight chamber;

coupling the air tight chamber to the secondary chamber;

measuring a second air pressure within the air tight chamber; and determining the volume of the region of the substrate based on the first and second air pressures and based on the volume of the concave section and the volume of the secondary chamber.

11. The method of claim 10, wherein the region is a concave region, wherein the probe is part of a dispensing system for dispensing material into the concave region, and wherein the method further includes a step of:

setting a quantity of material to be dispensed based on the measured volume of the concave region.

12. The method of claim 11, further including a step of:

dispensing material from the dispensing system into the concave region;

using the measuring probe, measuring the volume of material dispensed.

13. The method of claim 12, further comprising a step of:

adjusting the quantity of material to be dispensed based on the measured volume of material dispensed.

14. A dispensing system for dispensing material into a cavity of a substrate, the cavity having an unknown volume, the dispensing system comprising:

a housing;

a dispensing apparatus, coupled to the housing, that dispenses a metered quantity of material; and means for measuring the volume of the cavity based on measurements of air pressure within the cavity.

15. The dispensing system of claim 14, further comprising means for controlling the quantity of material dispensed from the dispensing apparatus based on the volume of the cavity.

16. The dispensing system of claim 15, further comprising means for measuring the volume of material dispensed from the dispensing apparatus.

17. The dispensing system of claim 16, further comprising means for adjusting the quantity of material dispensed based on the measured volume of the material dispensed.

18. A dispensing system for dispensing material onto a substrate, the dispensed material having a volume, the dispensing system comprising:

a housing;

a dispensing apparatus, coupled to the housing, that dispenses a metered quantity of material; and a volumetric measuring probe coupled to the housing and positionable over the material dispensed onto the substrate to measure the volume of the material, the volumetric measuring probe including a concave section having a mating edge that is constructed and arranged to create a substantially air tight seal between the probe and the substrate the concave section having a volume.

19. The dispensing system of claim 18, further comprising a computer control system, coupled to the dispensing apparatus to control the quantity of material dispensed, and coupled to the volumetric measuring probe to receive measurement information from the volumetric measuring probe to determine the volume of the material dispensed.

20. The dispensing system of claim 19, wherein the computer control system is configured to control the quantity of material to be dispensed from the dispensing apparatus based on the determined volume of the material dispensed.

21. The dispensing system of claim 20, wherein the volumetric measuring probe includes:
    a chamber having a volume;
    a first valve, disposed between the chamber and the concave section, having an open position such that the chamber is coupled to the concave section, and having a closed position such that the chamber is isolated from the concave section;
    a pressure transducer coupled to the concave section to determine air pressure within the concave section; and
    wherein the probe is constructed and arranged such that when the probe is sealed to the substrate a substantially air tight chamber is formed having a volume equal to the sum of the volume of the concave section and the volume of the cavity of the substrate.

22. The dispensing system of claim 21, wherein the volumetric measuring probe further includes:
    a first port for allowing air to enter and exit the volumetric probe;
    a second valve, disposed between the first port and the concave section, having an open position such that the concave section is coupled to the first port, and having a closed position such that the concave section is isolated from the first port;
    a second port for allowing air to enter and exit the volumetric probe; and
    a third valve, disposed between the chamber and the second port, having an open position such that the chamber is coupled to the second port, and having a closed position such that the chamber is isolated from the second port.

23. A dispensing system for dispensing material onto a substrate, the dispensed material having a volume, the dispensing system comprising:
    a housing;
    a dispensing apparatus, coupled to the housing, that dispenses a metered quantity of material; and
    a volumetric measuring probe coupled to the housing and positionable over the material dispensed onto the substrate to measure the volume of the material, the volumetric measuring probe includes:
        a concave section having a mating edge that is constructed and arranged to create a substantially air tight seal between the probe and the substrate, the concave section having a volume;
        a chamber having a volume;
        a first valve, disposed between the chamber and the concave section, having an open position such that the chamber is coupled to the concave section, and having a closed position such that the chamber is isolated from the concave section;
        a pressure transducer coupled to the concave section to determine air pressure within the concave section; and
        wherein the probe is constructed and arranged such that when the probe is sealed to the substrate a substantially air tight chamber is formed having a volume equal to the sum of the volume of the concave section and the volume of the cavity of the substrate.

24. The dispensing system of claim 23, wherein the volumetric measuring probe further includes:
    a first port for allowing air to enter and exit the volumetric probe;
    a second valve, disposed between the first port and the concave section, having an open position such that the concave section is coupled to the first port, and having a closed position such that the concave section is isolated from the first port;
    a second port for allowing air to enter and exit the volumetric probe; and
    a third valve, disposed between the chamber and the second port, having an open position such that the chamber is coupled to the second port, and having a closed position such that the chamber is isolated from the second port.

25. An inspection apparatus for determining volume of material on a substrate, the inspection apparatus comprising:
    a housing having a base plate for supporting the substrate in the apparatus;
    a volumetric measuring probe, coupled to the housing, positionable over the material on the substrate to measure the volume of the material, the volumetric measuring probe having a concave section having a mating edge that is constructed and arranged to create a substantially air tight seal between the probe and the substrate the concave section having a volume.

26. The inspection apparatus of claim 25, wherein the volumetric measuring probe includes:
    a chamber having a volume;
    a first valve, disposed between the chamber and the concave section, having an open position such that the chamber is coupled to the concave section, and having a closed position such that the chamber is isolated from the concave section;
    a pressure transducer coupled to the concave section to determine air pressure within the concave section; and
    wherein the probe is constructed and arranged such that when the probe is sealed to the substrate a substantially air tight chamber is formed having a volume equal to the difference between the volume of the concave section and the volume of the material.

27. The inspection apparatus of claim 26, wherein the volumetric measuring probe further includes:
    a first port for allowing air to enter and exit the volumetric probe;
    a second valve, disposed between the first port and the concave section, having an open position such that the concave section is coupled to the first port, and having a closed position such that the concave section is isolated from the first port;
    a second port for allowing air to enter and exit the volumetric probe; and
    a third valve, disposed between the chamber and the second port, having an open position such that the chamber is coupled to the second port, and having a closed position such that the chamber is isolated from the second port.

28. The inspection apparatus of claim 27, wherein the material on the substrate is a solder ball grid array and wherein the inspection apparatus is constructed and arranged to measure the volume of the solder of the solder ball grid array.

29. The inspection apparatus of claim 25, wherein the material on the substrate is a solder ball grid array and wherein the inspection apparatus is constructed and arranged to measure the volume of the solder of the solder ball grid array.

* * * * *